(12) United States Patent
Uratani et al.

(10) Patent No.: US 8,011,874 B2
(45) Date of Patent: Sep. 6, 2011

(54) TRANSFER APPARATUS

(75) Inventors: Takafumi Uratani, Osaka (JP); Daisuke Sado, Osaka (JP); Hideki Matsuo, Osaka (JP)

(73) Assignee: Daihen Corporation, Osaka (JP)

( * ) Notice: Subject to any disclaimer, the term of this patent is extended or adjusted under 35 U.S.C. 154(b) by 263 days.

(21) Appl. No.: 12/220,535

(22) Filed: Jul. 25, 2008

(65) Prior Publication Data

US 2009/0035114 A1   Feb. 5, 2009

(30) Foreign Application Priority Data

Jul. 27, 2007   (JP) .................................. 2007-195307

(51) Int. Cl.
  *B25J 18/04* (2006.01)
(52) U.S. Cl. ............... 414/744.3; 74/490.01; 414/744.5; 414/744.6; 901/15
(58) Field of Classification Search ............... 414/744.6, 414/744.3, 718, 728; 901/15; 74/23, 25, 74/424.71, 841, 490.01
See application file for complete search history.

(56) References Cited

U.S. PATENT DOCUMENTS

| | | | | |
|---|---|---|---|---|
| 4,255,076 A | * | 3/1981 | Svenning | 414/729 |
| 4,466,769 A | * | 8/1984 | Inaba et al. | 414/744.3 |
| 5,135,349 A | * | 8/1992 | Lorenz et al. | 414/744.6 |
| 2005/0036877 A1 | | 2/2005 | Ogawa et al. | |

FOREIGN PATENT DOCUMENTS

JP       2005-125479       5/2005

* cited by examiner

*Primary Examiner* — Donald Underwood
(74) *Attorney, Agent, or Firm* — Hamre, Schumann, Mueller & Larson, P.C.

(57) ABSTRACT

A transfer apparatus includes a stationary base, a lift base, a lifting mechanism for vertically moving the lift base, a rotary base mounted to the lift base, a rotating mechanism for rotating the rotary base about a vertical rotation axis, a linear moving mechanism supported by the rotary base, and a work hand supported by the linear moving mechanism. The lifting mechanism includes a slide guide mechanism for vertical movement of the lift base, and first and second screw-feeding mechanisms. Each screw-feeding mechanism includes a rotatable vertical screw shaft, and a nut member provided on the lift base and screwed onto the screw shaft. The first and the second screw-feeding mechanisms are spaced from each other, with the rotation axis of the rotary base being located between the first and the second screw-feeding mechanisms.

7 Claims, 5 Drawing Sheets

TRANSFER APPARATUS

BACKGROUND OF THE INVENTION

1. Field of the Invention

The present invention generally relates to a transfer apparatus. In particular, it relates to a transfer apparatus for linearly transferring a thin work such as a wafer and a glass substrate used in the fabrication process of semiconductor devices or liquid crystal display panels.

2. Description of the Related Art

A transfer apparatus provided with a linear moving mechanism for moving a work-holding hand along a linear path has a simpler structure and is less expensive than a jointed-arm robot. Thus, such a linear transfer apparatus is often used for carrying in or out a thin work (a wafer, a glass substrate, etc.) relative to a process chamber in manufacturing semiconductor devices or liquid crystal display panels, for example.

An example of a conventional linear transfer apparatus is disclosed in JP-A-2005-125479. The transfer apparatus disclosed includes a link arm mechanism supported by a rotary base. A hand for horizontally holding a work such as a substrate is mounted to an end of the link arm mechanism. The rotary base is mounted to a cylindrical lift base supported by the stationary base to be movable vertically. In accordance with the vertical movement of the lift base, the hand supported by the rotary base is brought to a predetermined height. When the rotary base rotates on the stationary base about a vertical rotation axis, the link arm mechanism rotates correspondingly. When the link arm mechanism pivots, the work held by the hand moves linearly within a horizontal plane. Thus, the work is transferred from a certain position to another position.

The conventional transfer apparatus includes lifting means for vertically moving the lift base, and this lifting means comprises two slide guide mechanisms and a single screw-feeding mechanism (see FIG. 21 of JP-A-2005-125479). The slide guide mechanisms facilitate the vertical slide movement of the lift base and arranged to be spaced from each other. Each of the slide guide mechanisms is made up of a vertically extending guide rail provided at the stationary base and a guide member provided at the lift base. The guide member is in sliding engagement with the guide rail. The screw-feeding mechanism applies driving force for the vertical movement to the lift base. The screw-feeding mechanism comprises a vertically extending screw shaft rotatably mounted to the stationary base and a nut member provided at the lift base. The nut member is screwed onto the screw shaft. When the screw shaft rotates, the lift base moves vertically with the nut member.

The transfer apparatus including the above-described linear moving mechanism may be used for carrying in or out a work relative to a process chamber in the process of manufacturing a semiconductor device or a liquid crystal display panel. Specifically, for instance, a vacuum transfer module may be disposed between an atmospheric transfer module and each process chamber, and the transfer of the work may be performed via the vacuum transfer module. The vacuum transfer module includes a transport chamber around which a plurality of process chambers are arranged, and a load lock connecting the atmospheric transfer module and the transport chamber to each other. The transfer apparatus operable in a vacuum is disposed in the transport chamber. The transfer apparatus performs operations such as receiving a work from the load lock, transferring a work into the transport chamber, transferring a work into any of the process chambers, receiving a processed work from a process chamber, and transferring a work into the load lock. A stage for placing a work is provided in the load lock. The transfer of a work is performed on the stage by a hand of the transfer apparatus.

In the transfer apparatus, the load of the hand and a work is applied to the lift base via the slide guide mechanism and the screw-feeding mechanism. When the work is positioned directly above the stationary base, the load applied to the slide guide mechanisms and that on the screw-feeding mechanism are substantially well-balanced, so that the vertical movement is performed properly. However, when the work is held at a location deviated from the position directly above the stationary base, biasing load or moment load is applied to the slide guide mechanism and the screw-feeding mechanism. In this case, due to the biasing load or the moment load, positional deviation in the vertical direction may occur in the slide guide mechanism and the screw-feeding mechanism. When the positional deviation occurs, the vertical movement of the lift base may not be performed smoothly or the hand may not be held horizontally. Further, in recent years, in accordance with an increase in size of works, there are demands for increasing the distance of the horizontal transfer movement. However, such an increase causes an increase in biasing load and moment load, which encourages the above-described disadvantage.

SUMMARY OF THE INVENTION

The present invention has been proposed under the circumstances described above. It is therefore an object of the present invention to provide a transfer apparatus which is capable of reducing the influence of biasing load and moment load caused by a hand and a work to ensure stable vertical movement.

According to the present invention, there is provided a transfer apparatus comprising: a stationary base; a lift base; a lifting mechanism for vertically moving the lift base relative to the stationary base; a rotary base mounted to the lift base; a rotating mechanism for rotating the rotary base about a vertical rotation axis; a linear moving mechanism supported by the rotary base; and a hand used for holding a work and supported by the linear moving mechanism. The lifting mechanism includes a slide guide mechanism for guiding vertical movement of the lift base, a first screw-feeding mechanism, and a second screw-feeding mechanism. Each of the first and the second screw-feeding mechanisms includes a rotatable vertical screw shaft, and a nut member provided on the lift base and screwed onto the screw shaft. The first and the second screw-feeding mechanisms are spaced from each other, with the rotation axis being located between the first and the second screw-feeding mechanisms.

Preferably, the slide guide mechanism may include a vertical guide rail, and a guide member provided on the lift base and held in sliding engagement with the guide rail.

Preferably, the first and the second screw-feeding mechanisms may be driven in synchronism with each other. To this end, the transfer apparatus of the present invention may further comprise a first and a second pulleys of the same diameter, and a driving belt held in engagement with the first and the second pulleys. The first pulley may be provided at a lower end of the screw shaft of the first screw-feeding mechanism, and the second pulley may be provided at a lower end of the screw shaft of the second screw-feeding mechanism.

Preferably, the slide guide mechanism may comprise two guide rails and two guide members, that is, a first vertical guide rail, a second vertical guide rail, a first guide member, and a second guide member, where the first and the second guide rails are adjacent to the first and the second screw-feeding mechanisms, respectively, and the first and the second guide members are provided on the lift base and held in sliding engagement with the first and the second guide rails, respectively.

Preferably, the first and the second guide rails may be provided on the same side of an imaginary vertical plane that contains axes of the screw shafts of the first and the second screw-feeding mechanisms. In such an instance, the two guide rails may be spaced apart from the imaginary plane or on the plane.

Other features and advantages of the present invention will become apparent from the detailed description given below with reference to the accompanying drawings.

DETAILED DESCRIPTION OF THE PREFERRED EMBODIMENTS

Preferred embodiments of the present invention will be described below with reference to the accompanying drawings.

Figure 1:
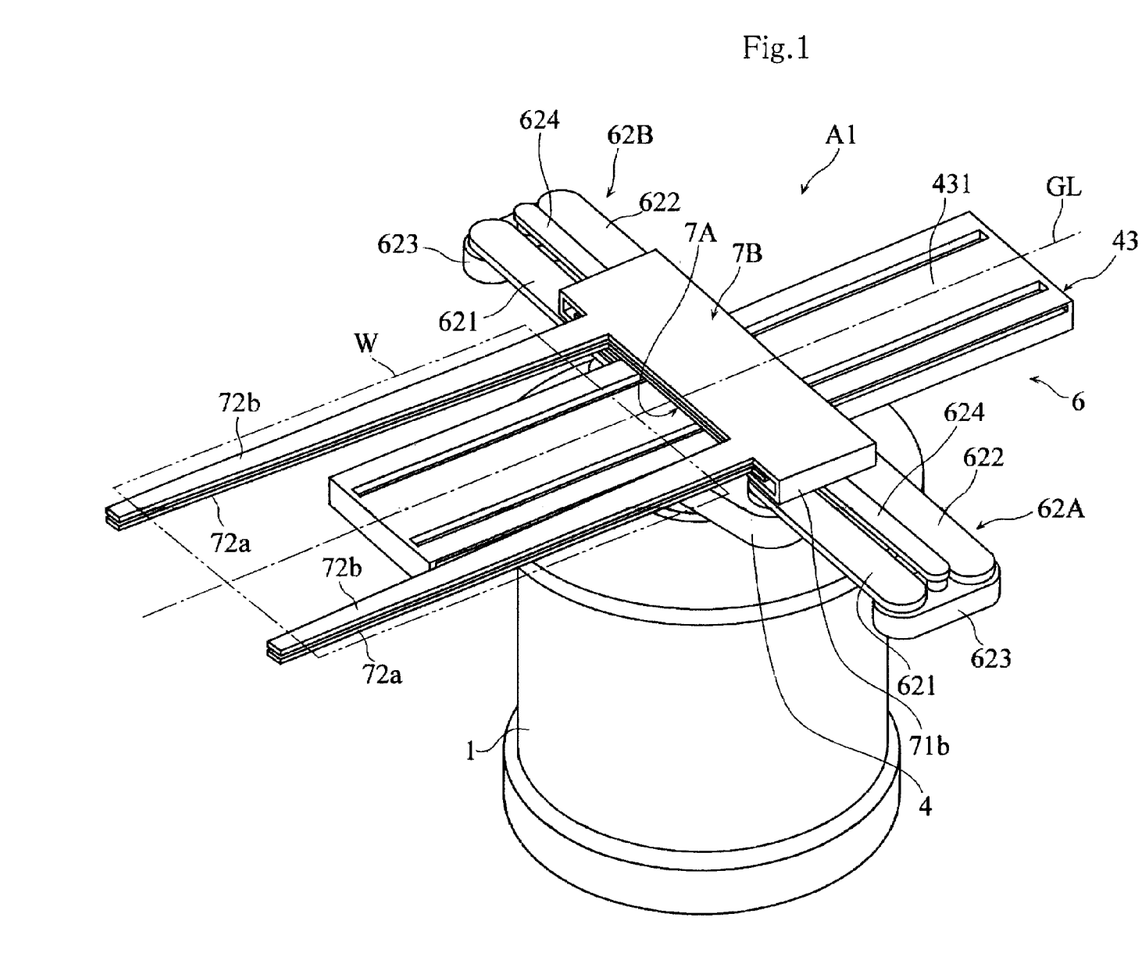
FIG. 1 is an overall perspective view showing a transfer apparatus according to the present invention.
Figure 2:
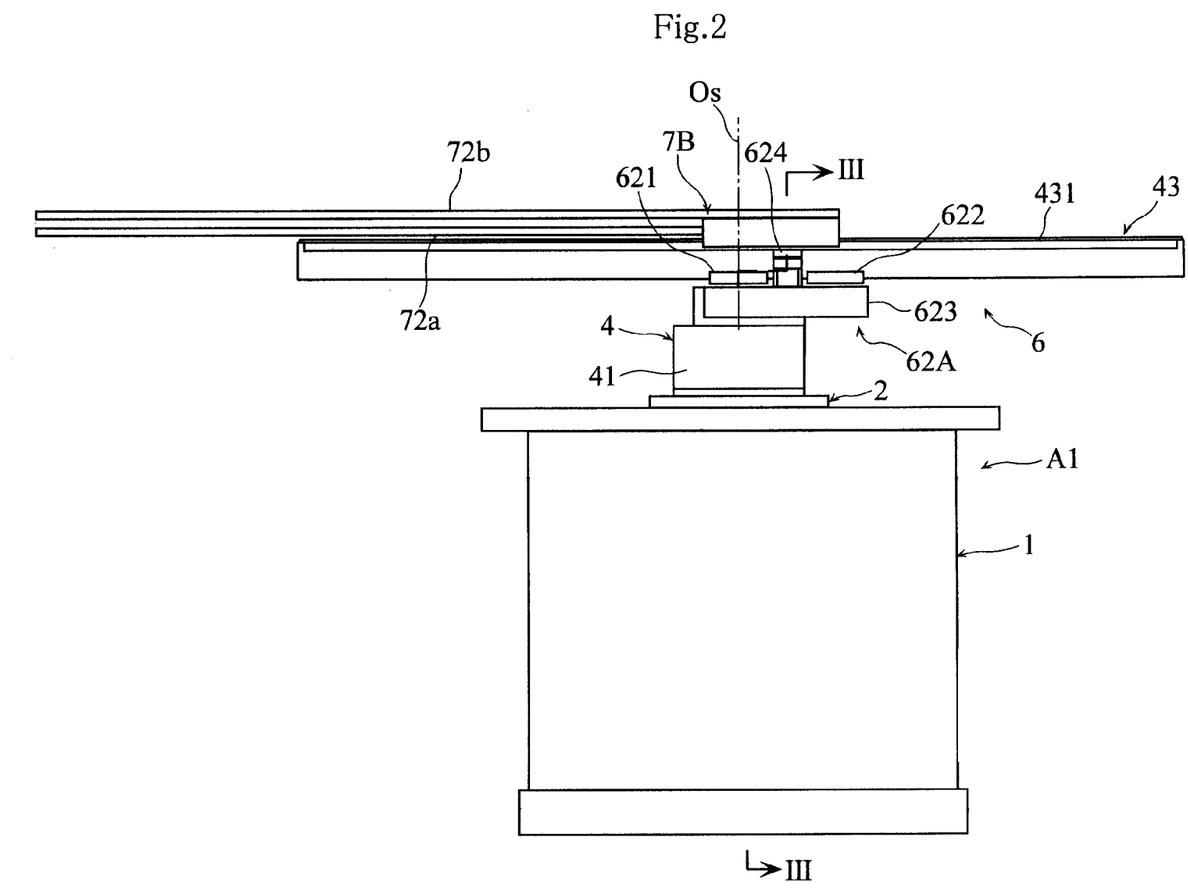
FIG. 2 is a side view of the transfer apparatus shown in FIG. 1.
Figure 3:
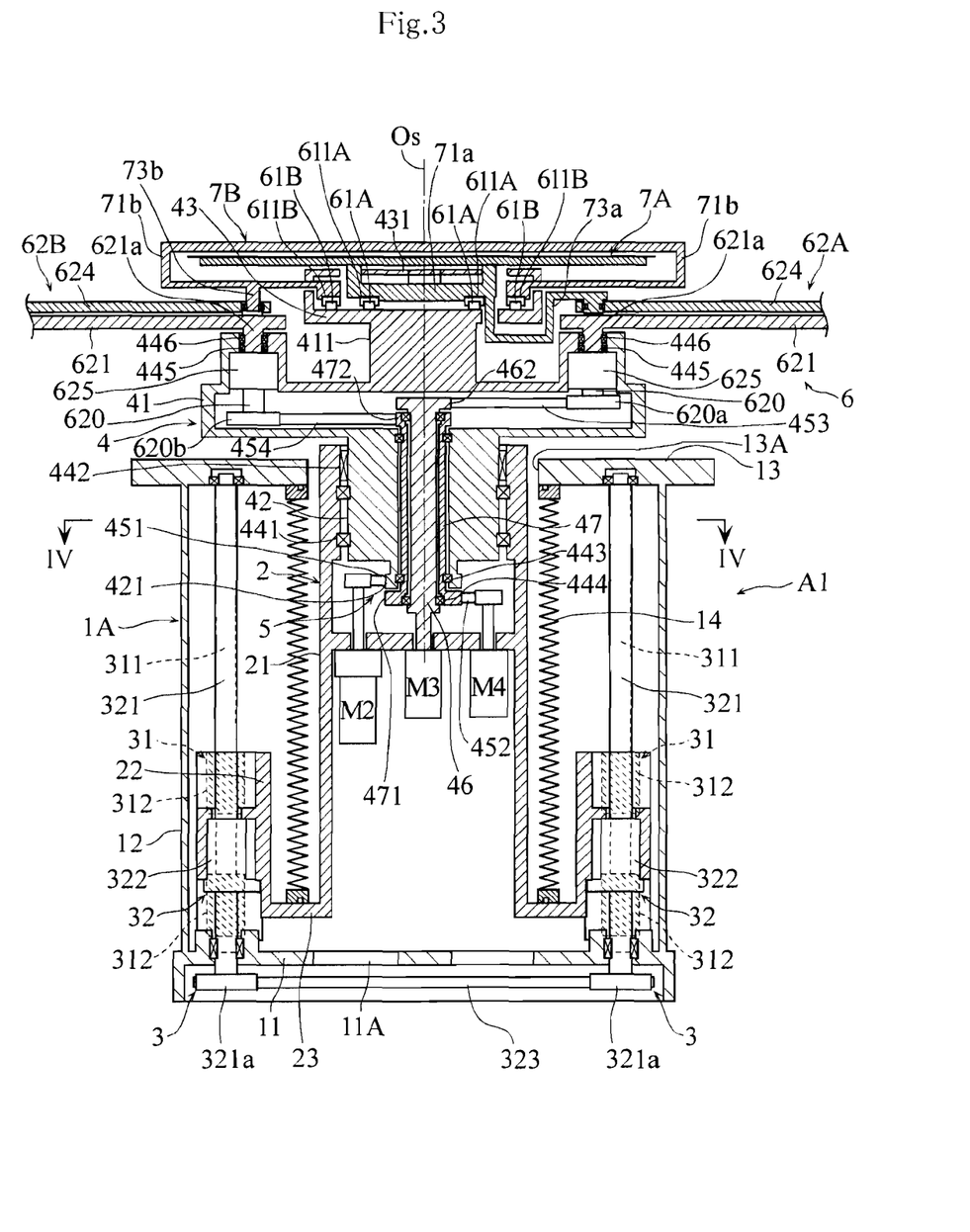
FIG. 3 is a sectional view taken along lines III-III in FIG. 2.

FIGS. 1-4 show a transfer apparatus according to the present invention. The transfer apparatus A1 may be used for transferring a work in the form of a thin plate such as a substrate for a liquid crystal display panel. As shown in FIGS. 1 and 3, the transfer apparatus A1 includes a stationary base 1, a lift base 2, a lifting mechanism 3 for vertically moving the lift base 2 relative to the stationary base 1, a rotary base 4 mounted on the lift base 2, and a rotating mechanism 5 for rotating the rotary base 4 about the vertical rotation axis Os. A linear moving mechanism 6 is mounted on the rotary base 4. A pair of hands 7A and 7B are individually mounted on the linear moving mechanism 6. The hands 7A and 7B serve to hold the work W in a horizontal posture.

As better shown in FIG. 3, the stationary base 1 includes a housing 1A having a generally columnar outer configuration made up of a bottom wall 11, a cylindrical side wall 12 and a top wall 13. The top wall 13 is formed with a center opening 13A. The bottom wall 11 is utilized for mounting a motor M1 and a screw shaft 321 of the lifting mechanism 3, which will be described later. The bottom wall 11 is formed with openings 11A. As better shown in FIGS. 3 and 4, the side wall 12 of the housing 1A is provided with two vertically-extending guide rails 311. The guide rails 311 constitute a slide guide mechanism 31, which will be described later.

As shown in FIG. 3, the lift base 2 includes an inner cylindrical portion 21 having a predetermined dimension in the vertical direction, an outer cylindrical portion 22, and a bottom wall 23 connecting respective lower ends of the cylindrical portions 21 and 22 to each other. The outer diameter of the inner cylindrical portion 22 is smaller than the center opening 13A of the top wall 13 of the stationary base 1. The upper end of the outer cylindrical portion 22 is positioned lower than the upper end of the inner cylindrical portion 21.

Figure 4:
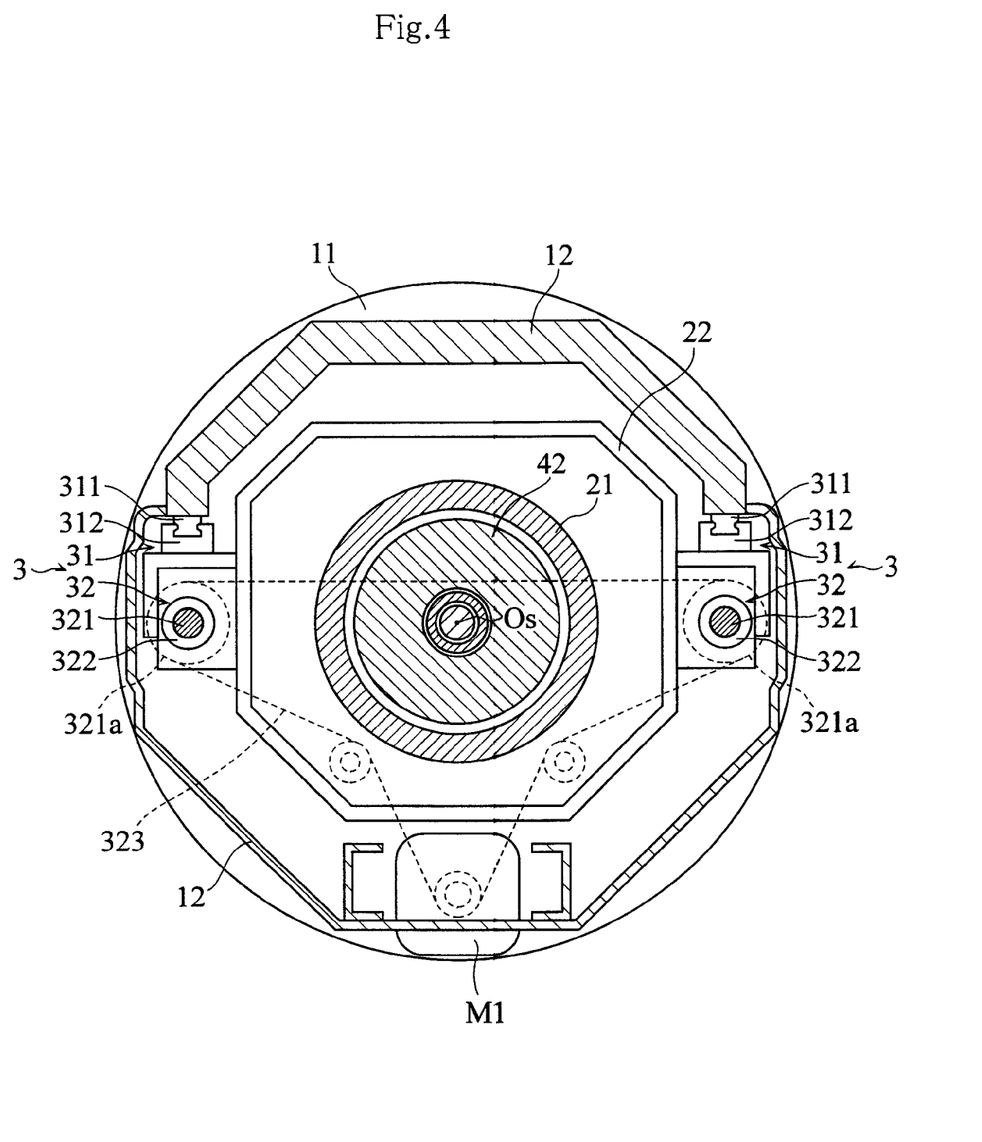
FIG. 4 is a sectional view taken along lines IV-IV in FIG. 3.

The lifting mechanism 3 serves to move the lift base 2 vertically relative to the stationary base 1. As shown in FIGS. 3 and 4, the lifting mechanism 3 includes slide guide mechanisms 31 and screw-feeding mechanisms 32. The slide guide mechanisms 31 make the lift base 2 slidable linearly in the vertical direction. In this embodiment, two slide guide mechanisms 31 are arranged to be spaced from each other. Each of the slide guide mechanisms 31 is made up of the above-described guide rail 311 and two guide members 312 (hatched with broken lines in FIG. 3) mounted to the lift base 2. The guide members 312 slidably engage with the guide rail 311. With this arrangement, the lift base 2 is movable relative to the stationary base 1 in the vertical direction in FIG. 3 within a predetermined range. In this movement, the inner cylindrical portion 21 of the lift base 2 projects from the center opening 13A of the housing 1A. As the slide guide mechanism 31 having the above-described structure, a linear guide incorporating a linear motion bearing may be employed.

The screw-feeding mechanisms 32 serve to apply driving force for the vertical movement to the lift base 2. As shown in FIG. 3, each of the screw-feeding mechanisms 32 is a ball screw mechanism comprising a vertically extending screw shaft 321 which is rotatable, and a nut member 322 screwed onto the screw shaft 321. In this embodiment, two screw-feeding mechanisms 32 are provided. As better shown in FIG. 4, the two screw-feeding mechanisms 32 face each other across the rotation axis Os and are spaced from the rotation axis Os by a substantially equal distance.

As shown in FIG. 3, each of the screw shafts 321 has opposite ends rotatably supported by the stationary base 1. The nut member 322 is fixed to the outer circumferential portion of the outer cylindrical portion 22 of the lift base 2. The respective lower ends of the two screw shafts 321 are provided with pulleys 321a having the same diameter. As shown in FIG. 4, the two screw shafts 321 are connected to the motor M1 by a belt 323 wound on the pulleys 321a. With this arrangement, when the motor M1 is driven, the two screw shafts 321 rotate forwardly and reversely in synchronism. Due to the rotation of the two screw shafts 321, the lift base 2 moves vertically along the guide rails 311.

As shown in FIG. 4, each of the two slide guide mechanisms 31 is paired with a respective one of the two screw-feeding mechanisms 32. Specifically, the slide guide mechanism 31 and the screw-feeding mechanism 32 on the left side in FIG. 4 are arranged close to each other to make a pair. Similarly, the slide guide mechanism 31 and the screw-feeding mechanism 32 on the right side in FIG. 4 are arranged close to each other to make a pair. The two slide guide mechanisms 31 are arranged on the same side of a vertical plane including respective screw shafts 321 of the two screw-feeding mechanisms 32.

As shown in FIG. 3, a bellows 14 is disposed to surround the inner cylindrical portion 21 of the lift base 2. The ends of the bellows 14 are connected to the top wall 13 of the stationary base 1 and the bottom wall 23 of the lift base 2, respectively. The bellows 14 hermetically seals the space between the top wall 13 of the stationary base 1 and the bottom wall 23 of the lift base 2 regardless of the vertical movement of the lift base 2. In FIG. 4, the illustration of the bellows 14 is omitted.

The rotary base 4 includes a housing 41 and a cylindrical shaft 42 connected to the lower portion of the housing 41. The cylindrical shaft 42 is supported by the inner cylindrical portion 21 of the lift base 2 via a bearing 441 to be rotatable about the rotation axis Os. A sealing mechanism 442 is provided between the inner cylindrical portion 21 and the cylindrical shaft 42. The sealing mechanism 442 separates the space above the sealing mechanism 442 and the space under the sealing mechanism 442 and inward of the lift base 2 to provide air tightness.

The rotating mechanism 5 serves to rotate the rotary base 4 about the rotation axis Os regardless of the position of the lift base 2 in the vertical direction. As shown in FIG. 3, the rotating mechanism 5 includes a pulley 421 provided at the lower end of the cylindrical shaft 42 of the rotary base 4 and a belt 451 wound on the pulley 421. The pulley 421 is connected, via the belt 451, to a motor M2 supported by the inner cylindrical portion 21 of the lift base 2. With this arrangement, when the motor M2 is driven, the rotary base 4 rotates about the rotation axis Os.

Transmission shafts 46 and 47 for transmitting driving force to link arm mechanisms 62A and 62B, which will be described later, are arranged in the cylindrical shaft 21 of the rotary base 4 coaxially along the rotation axis Os. The transmission shaft 47 is cylindrical and rotatably supported in the cylindrical shaft 41 via a bearing 443. The transmission shaft 46 is rotatably supported in the transmission shaft 47 via a bearing 444. The lower end of the transmission shaft 46 is connected to the output shaft of a motor M3 supported by the inner cylindrical portion 21 of the lift base 2. The lower end of the transmission shaft 47 is provided with a pulley 471. A belt 452 is wound between the pulley 471 and a pulley mounted to the output shaft of a motor M4 supported by the inner cylindrical portion 21. The upper ends of the transmission shafts 46 and 47 are provided with pulleys 462 and 472, respectively.

The linear moving mechanism 6 serves to transfer the hands 7A, 7B along a horizontal straight movement path GL. As shown in FIG. 3, the linear moving mechanism 6 comprises guide rails 61 and 61B mounted on a guide member 43, and link arm mechanisms 62A and 62B for transmitting horizontal driving force to the hands 7A, 7B.

The guide member 43 supporting the guide rails 61A and 61B is in the form of an elongated rectangle having a horizontally-extending longitudinal axis (movement path GL) as viewed in plan. The guide member 43 is fixed to the housing 41 of the rotary base 4. Specifically, as shown in FIG. 3, the rotary base 4 includes a post 411 connected to the center upper portion of the housing 41, and the guide member 43 is integrally connected to the upper portion of the post 411. The upper surface of the guide member 43 is covered with a cover 431 for covering the upper portions of the guide rails 61A and 61B.

The hand 7A is supported by a pair of inner guide rails 61A via a support arm 71a formed on the lower surface thereof and a slider 611A provided on the support arm 71a. The hand 7B is supported by a pair of outer guide rails 61B via a pair of support arms 71b formed outward of the sides of the hand 7A and a slider 611B provided on the support arm 71b.

The hands 7A and 7B are integrally formed with holder pieces 72a and 72b in the form of a fork extending in the longitudinal direction of the guide member 43. A work W in the form of a thin plate is to be placed on and held by the holder pieces 72a, 72b. The support arm 71a of the hand 7A is formed with an extension 73a. The extension 73a extends through a slit formed in the guide member 43 and under the outer guide rail 61B to the outside. An end of the arm 624 (right side one in FIG. 3) of the link arm mechanism 62A is rotatably connected to the extension 73a. The support arm 71b of the hand 7B is formed with a shaft 73b to which the arm 624 (left side one in FIG. 3) of the link arm mechanism 62B is rotatably connected.

Each of the link arm mechanisms 62A and 62B comprises a plurality of arms 621-624 connected to each other. Since the main structure and operation of the link arm mechanisms 62A, 62B is basically the same as conventional ones, the description thereof is omitted. The base end 621a of the arm 621 is rotatably held in an opening formed at the upper portion of the housing 41 of the rotary base 4 via a bearing 445. The lower end of the base end 621a is connected to a rotation shaft 620 via a deceleration mechanism 625. A sealing mechanism 446 for providing air tightness is provided between the base end 621a and the upper portion of the housing 41 at a position above the bearing 445. With this arrangement, the interior of the housing 41 and the internal space of the lift base 2 communicating with the interior of the housing 41 via the cylindrical shaft 42 are hermetically sealed from the outside.

The lower end of the rotation shaft 620 (right side one in FIG. 3) of the link arm mechanism 62A is provided with a pulley 620a. A belt 453 is wound between the pulley 620a and the pulley 462 of the transmission shaft 46. With this arrangement, when the motor M3 is driven, the rotational driving force of the motor M3 is transmitted to the rotation shaft 620 via the transmission shaft 46 and the belt 453, whereby the link arm mechanism 62A is driven. The lower end of the rotation shaft 620 (left side one in FIG. 3) of the link arm mechanism 62B is provided with a pulley 620b. A belt 454 is wound between the pulley 620b and the pulley 472 of the transmission shaft 47. With this arrangement, when the motor M4 is driven, the rotational driving force of the motor M4 is transmitted to the rotation shaft 620 via the belt 452, the transmission shaft 47 and the belt 454, whereby the link arm mechanism 62B is driven.

When the link arm mechanism 62A is driven, the lower hand 7A slides horizontally while being supported by the two inner guide rails 61A. When the link arm mechanism 62B is driven, the upper hand 7B slides horizontally while being supported by the two outer two guide rails 61B without coming into contact with the hand 7A. In this process, the extension 73a connecting the hand 7A and the link arm mechanism 62A to each other slides without being interfered by the guide member 43. Thus, the work W placed on the holder pieces 72a, 72b of the hands 7A, 7B stably keeps its posture.

Figure 5:
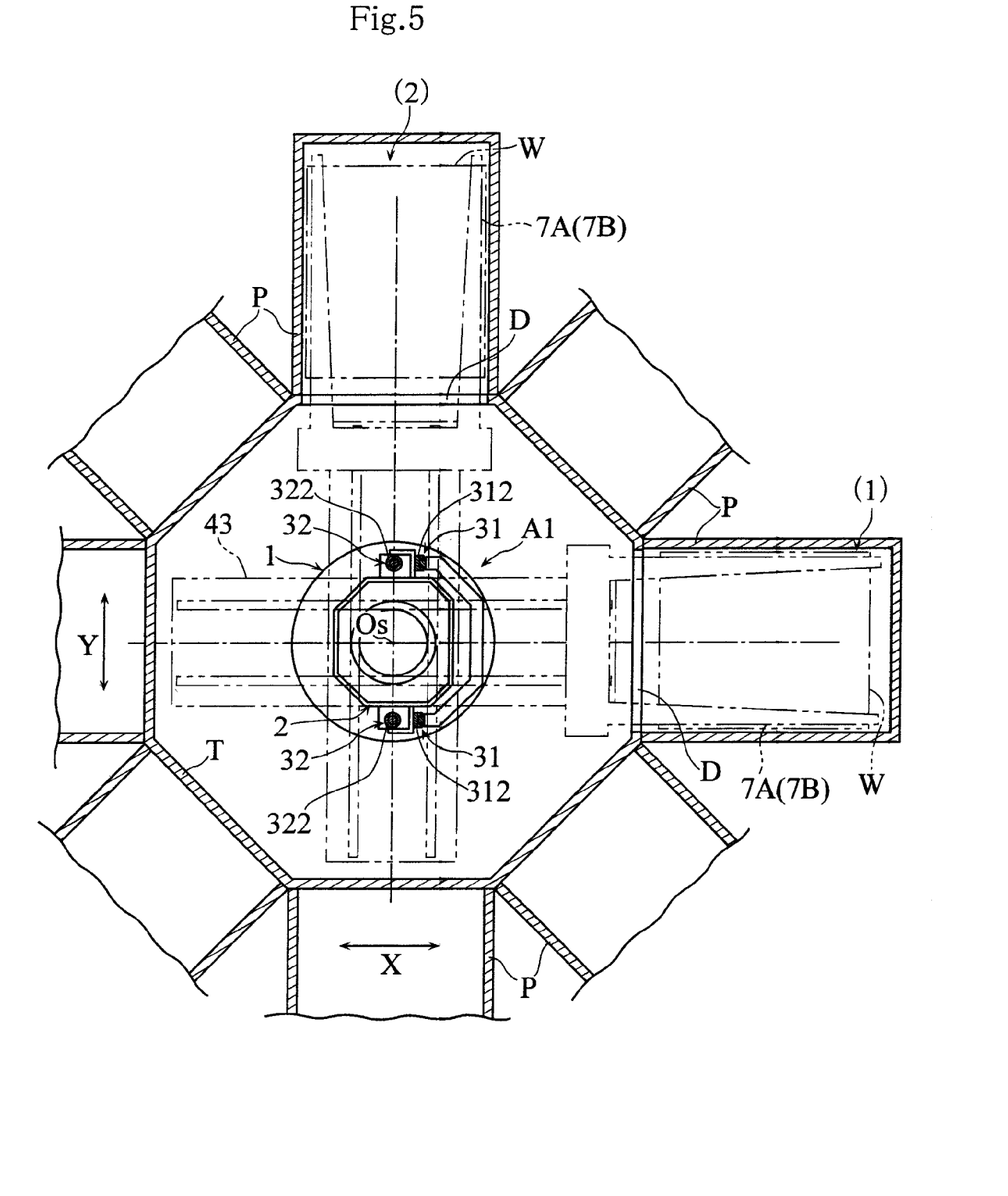
FIG. 5 is a plan view for describing the operation of the transfer apparatus according to the present invention.

The transfer apparatus A1 having the above-described structure may be used for carrying in or out a work relative to a process chamber in the process of manufacturing a liquid crystal display panel. As shown in FIG. 5, the transfer apparatus A1 may be placed in a transport chamber T in a vacuum around which a plurality of process chambers P are arranged. The transport chamber T can communicate with the process chambers P via doors D. By opening the door D, the transfer apparatus A1 can transfer a work W to the process chamber P. It is to be noted that only the structural elements necessary for describing the transfer apparatus A1 are shown in FIG. 5, and the illustration of other structural elements is appropriately omitted.

In recent years, due to the diversification of the vacuum process utilizing transport chambers and process chambers, the number of process chambers to be deployed around a transport chamber tends to increase. In the example shown in FIG. 5, the transport chamber T is octagonal as viewed in plan and at each side of the octagon, a process chamber P or a load lock is provided.

The phantom lines in FIG. 5 indicate an access state (1) where the hand 7A (7B) carrying a work W is operated with respect to the process chamber P on the right side and an access state (2) where the hand 7A (7B) is operated with respect to the process chamber P on the upper side.

In the state (1), the work W and the hand 7A (7B) are positioned at a location deviated from above the stationary base 1 in the X direction (which is perpendicular to the direction in which the two slide guide mechanisms 31 are spaced from each other). It should be noted here that the two guide members 312 (and hence the two slide guide mechanisms 31), vertically spaced from each other in the figure, are connected via the lift base 2 to be integral with each other. Thus, the slide guide mechanisms 31 can provide high work-supporting rigidity against the biasing load in the x direction or the moment load caused by the biasing load. Thus, in the state (1), the work W is properly held in the horizontal posture, and the lift base 2 can smoothly slide vertically.

Further, the two screw-feeding mechanisms 32 are arranged adjacent to the respective slide guide mechanisms 31 in the X direction. These screw-feeding mechanisms 32 serve to enhance the work-supporting rigidity against the biasing load (and the moment load) in the x direction.

In the state (2), the work W and the hand 7A (7B) are positioned at a location deviated from above the stationary base 1 in the Y direction in which the screw-feeding mechanisms 32 are spaced from each other. Since the two nut members 322 (hence the screw-feeding mechanisms 32) are connected to be integral with each other via the lift base 2, the screw-feeding mechanisms 32 provide high work-supporting rigidity. Thus, in the state (2) again, the work W is properly held in the horizontal posture, and the lift base 2 can smoothly slide vertically.

Supposing that only one screw-feeding mechanism 32 is provided, the above-described high rigidity cannot be obtained. Further, in this case, a relatively large biasing load is applied to one of the slide guide mechanisms 31, whereby some difference in height may be present between the two slide guide mechanisms 31. Such problems do not occur with the above-described embodiment, since two screw-feeding mechanisms 32 are provided.

As understood from the above, in the transfer apparatus A1 of the present invention, high work-supporting rigidity is exerted against the biasing load and the moment load in the two perpendicular directions by devising the arrangement of the slide guide mechanisms 31 and the screw-feeding mechanisms 32. Thus, in no matter what direction about the rotation axis Os the transfer apparatus may access, the influence of the biasing load and moment load by the work W and the hand 7A (7B) is effectively reduced, thereby ensuring smooth and reliable vertical movement.

The above-described embodiment uses two screw-feeding mechanisms. The present invention is not limited to this, and three or more screw-feeding mechanisms may be employed.

In the foregoing embodiment, the two slide guide mechanisms 31 (the guide rails 311, the guide members 312) are arranged on the same side of and spaced apart from a vertical plane containing the axes of the screw shafts 321 of the two screw-feeding mechanisms 32. Alternatively, the slide guide mechanisms 31 (the guide rails 311, the guide members 312) may be arranged on the vertical plane or on the opposite sides of the vertical plane.

According to the present invention, only one slide guide mechanism 31 may be provided instead of two. In this case, the single slide guide mechanism 31 may be disposed at a position spaced from the rotation axis Os in a direction perpendicular to the direction in which the two screw-feeding mechanisms 32 are spaced to face each other. With this arrangement, high work-supporting rigidity is obtainable against the biasing load in the perpendicular direction mentioned above.

In the embodiment described above, as shown in FIG. 4, the right and left slide guide mechanisms 31 are arranged on an imaginary reference plane and oriented in the same direction. More specifically, in each of the slide guide mechanisms 31, the guide rail 311 and the guide member 312 are aligned in the normal direction of the reference plane, with the guide member 312 located between the reference plane and the guide rail 311. Differing from this configuration, the right and left slide guide mechanisms 31 may be oriented in the opposite directions, with the rotation axis Os located at the middle between the two slide guide mechanisms 31. In this instance, the right slide guide mechanism 31 may be disposed adjacently on the right side of the right screw-feeding mechanism 32, with its guide member 312 located between its guide rail 311 and the right screw-feeding mechanism 32. Symmetrically, the left slide guide mechanism 31 may be disposed adjacently on the left side of the left screw-feeding mechanism 32, with its guide member 312 located between its guide rail 311 and the left screw-feeding mechanism 32.

In the present invention, the linear moving mechanism may not use a guide rail for guiding a hand. For linear movement of a hand, the link arm mechanism may be replaced by a belt-driven mechanism in which the hand is movably supported on a guide rail and driven by a belt connected to the hand.

In the above-described embodiment, two hands 7A, 7B are provided for carrying a work. Alternatively, a single hand configuration may be employed.

The present invention is applicable not only to a transfer apparatus used under vacuum as described above, but also to one used under atmospheric pressure.

The invention claimed is:

1. A transfer apparatus comprising:
a stationary base;
a lift base;
a lifting mechanism for vertically moving the lift base relative to the stationary base;
a rotary base mounted to the lift base;
a rotating mechanism for rotating the rotary base about a vertical rotation axis;
a linear moving mechanism supported by the rotary base; and
a hand for holding a work, the hand being supported by the linear moving mechanism;
wherein the lifting mechanism includes a slide guide mechanism for guiding vertical movement of the lift base, a first screw-feeding mechanism, and a second screw-feeding mechanism,
wherein each of the first and the second screw-feeding mechanisms includes a rotatable vertical screw shaft, and a nut member provided on the lift base and screwed onto the screw shaft, the first and the second screw-feeding mechanisms being spaced from each other with the rotation axis being located between the first and the second screw-feeding mechanisms,
wherein the slide guide mechanism comprises a first vertical guide rail and a first pair of guide members fixed to the lift base and held in sliding engagement with the first vertical guide rail, the first pair of guide members being spaced vertically from each other along the first vertical guide rail, and
wherein the pair of guide members includes an upper guide member located higher than the nut member and a lower guide member located lower than the nut member.

2. The transfer apparatus according to claim 1, wherein the first and the second screw-feeding mechanisms are driven in synchronism with each other.

3. The transfer apparatus according to claim 2, further comprising a first pulley and a second pulley that is diametrically equal to the first pulley, and a belt held in engagement with the first and second pulleys, wherein the first pulley is provided at a lower end of the screw shaft of the first screw-feeding mechanism, and the second pulley is provided at a lower end of the screw shaft of the second screw-feeding mechanism.

4. The transfer apparatus according to claim 1, wherein the slide guide mechanism comprises a second vertical guide rail, and a second pair of guide members, and wherein the second pair of guide members are fixed to the lift base and held in sliding engagement with the second vertical guide rail, the second pair of guide members are spaced vertically from each other along the second guide rail.

5. The transfer apparatus according to claim 4, wherein the first and the second vertical guide rails are provided on a same side of a vertical plane that contains axes of the screw shafts of the first and the second screw-feeding mechanisms.

6. The transfer apparatus according to claim 1, wherein the lift base comprises an inner cylindrical portion, an outer surrounding portion surrounding the inner cylindrical portion, and a bottom portion connecting the inner cylindrical portion to the outer surrounding portion, the pair of guide members as well as the nut members being fixed to the outer surrounding portion.

7. A transfer apparatus comprising:
   a stationary base;
   a lift base;
   a lifting mechanism for vertically moving the lift base relative to the stationary base;
   a rotary base mounted to the lift base;
   a rotating mechanism for rotating the rotary base about a vertical rotation axis;
   a linear moving mechanism supported by the rotary base; and
   a hand for holding a work, the hand being supported by the linear moving mechanism;
   wherein the lifting mechanism includes a slide guide mechanism for guiding vertical movement of the lift base, a first screw-feeding mechanism, and a second screw-feeding mechanism;
   wherein each of the first and the second screw-feeding mechanisms includes a rotatable vertical screw shaft, and a nut member provided on the lift base and screwed onto the screw shaft, the first and the second screw-feeding mechanisms being spaced from each other with the rotation axis being located between the first and the second screw-feeding mechanisms;
   wherein the slide guide mechanism comprises a vertical guide rail and a pair of guide members fixed to the lift base and held in sliding engagement with the vertical guide rail, the pair of guide members being spaced vertically from each other along the vertical guide rail; and
   wherein the lift base comprises an inner cylindrical portion, an outer surrounding portion surrounding the inner cylindrical portion, and a bottom portion connecting the inner cylindrical portion to the outer surrounding portion, the pair of guide members as well as the nut member being fixed to the outer surrounding portion.

\* \* \* \* \*